(12) United States Patent
Zhao

(10) Patent No.: US 9,362,387 B2
(45) Date of Patent: Jun. 7, 2016

(54) METHOD FOR PRODUCING MULTI-GATE IN FIN FIELD-EFFECT TRANSISTOR

(71) Applicant: Huawei Technologies Co., Ltd., Shenzhen (CN)

(72) Inventor: Jing Zhao, Shenzhen (CN)

(73) Assignee: Huawei Technologies Co., Ltd., Shenzhen (CN)

(*) Notice: Subject to any disclaimer, the term of this patent is extended or adjusted under 35 U.S.C. 154(b) by 0 days.

(21) Appl. No.: 14/585,615

(22) Filed: Dec. 30, 2014

(65) Prior Publication Data

US 2015/0228764 A1 Aug. 13, 2015

Related U.S. Application Data

(63) Continuation of application No. PCT/CN2014/071881, filed on Feb. 7, 2014.

(30) Foreign Application Priority Data

Feb. 5, 2013 (CN) .......................... 2013 1 0046136

(51) Int. Cl.
*H01L 29/66* (2006.01)
*H01L 21/28* (2006.01)

(52) U.S. Cl.
CPC .... *H01L 29/66795* (2013.01); *H01L 21/28008* (2013.01)

(58) Field of Classification Search
CPC .............. H01L 21/823841; H01L 21/823821; H01L 27/0886; H01L 27/0924; H01L 27/10879; H01L 29/41791; H01L 29/66795
USPC ........... 257/288, 368, 369; 438/151, 197, 199
See application file for complete search history.

(56) References Cited

U.S. PATENT DOCUMENTS

2005/0245035 A1* 11/2005 Lee ................... H01L 21/02381
438/285
2005/0255643 A1* 11/2005 Ahn .................... H01L 29/7851
438/197

(Continued)

FOREIGN PATENT DOCUMENTS

| CN | 1988116 A | 6/2007 |
|---|---|---|
| CN | 101140887 A | 3/2008 |
| CN | 101477986 A | 7/2009 |
| CN | 102130014 A | 7/2011 |
| WO | 2008005612 A1 | 1/2008 |

OTHER PUBLICATIONS

Foreign Communication From a Counterpart Application, Chinese Application No. 201310046136.1, Chinese Office Action dated Feb. 4, 2015, 5 pages.

(Continued)

*Primary Examiner* — Jarrett Stark
*Assistant Examiner* — Shahed Ahmed
(74) *Attorney, Agent, or Firm* — Conley Rose P.C.; Grant Rodolph; Nicholas K. Beaulieu

(57) ABSTRACT

A method for producing a multi-gate fin field-effect transistor (FinFET) is provided. The method includes forming a channel layer and a gate medium layer on a substrate; forming an amorphous silicon layer on the substrate, and etching the amorphous silicon layer, to form at least one fin; forming, by using an epitaxial growth process, a first protective layer from both sides to the middle of the substrate along a length direction of the at least one fin until a groove is formed in a middle location along the length direction of the at least one fin; forming a gate electrode layer on the substrate, performing planarization processing on the gate electrode layer to expose the first protective layer, and etching away the first protective layer by using an etching process, so as to form a gate electrode; and forming a source electrode and a drain electrode on the substrate.

13 Claims, 10 Drawing Sheets

(56) References Cited

U.S. PATENT DOCUMENTS

| | | |
|---|---|---|
| 2007/0065990 A1 | 3/2007 | Degroote et al. |
| 2009/0057761 A1 | 3/2009 | Kim et al. |
| 2009/0101977 A1* | 4/2009 | Iwamatsu ............. H01L 29/785 257/347 |
| 2009/0200616 A1* | 8/2009 | Shimizu .......... H01L 21/823842 257/369 |
| 2012/0104472 A1 | 5/2012 | Xu et al. |
| 2013/0270638 A1* | 10/2013 | Adam ............... H01L 29/66795 257/347 |
| 2014/0065779 A1 | 3/2014 | Zhang et al. |

OTHER PUBLICATIONS

Foreign Communication From a Counterpart Application, PCT Application No. PCT/CN2014/071881, English Translation of International Search Report dated May 13, 2014, 2 pages.

Foreign Communication From a Counterpart Application, PCT Application No. PCT/CN2014/071881, Written Opinion dated May 13, 2014, 4 pages.

* cited by examiner

METHOD FOR PRODUCING MULTI-GATE IN FIN FIELD-EFFECT TRANSISTOR

CROSS-REFERENCE TO RELATED APPLICATIONS

This application is a continuation of International Application No. PCT/CN2014/071881, filed on Feb. 7, 2014, which claims priority to Chinese Patent Application No. 201310046136.1, filed on Feb. 5, 2013, both of which are hereby incorporated by reference in their entireties.

TECHNICAL FIELD

Embodiments of the present invention relate to semiconductor technologies, and in particular, to a method for producing a multi-gate fin field-effect transistor (FinFET).

BACKGROUND

With the wide application and fast development of integrated circuits (IC), a FinFET, as an emerging field effect transistor (FET), is widely applied to various types of ICs because it is featured with a small component, a strong gate control ability and low power consumption and has an advantage of being compatible with an existing silicon process.

A method for producing the FinFET directly affects component performance of the FinFET. A method for producing the FinFET in the prior art is to form a fin on a substrate, grow a gate electrode material on the substrate, and then form a gate electrode pattern by using a pattern composition process such as photoetching to etch the gate electrode material, to finish production of a gate electrode. However, because the pattern composition process used in the method is limited by pattern composition process precision, it is very difficult for the gate electrode to be aligned with a central location, of the fin, along a length direction, thereby leading to imbalance of series resistance between a drain electrode and a source electrode, causing instability of a drain-electrode current, and seriously affecting stability of the FinFET component.

SUMMARY

Embodiments of the present invention provide a method for producing a multi-gate FinFET, so as to implement balance of series resistance between a drain electrode and a source electrode, enable a drain-electrode current to be stable, and ensure component performance of the multi-gate FinFET.

According to a first aspect, an embodiment of the present invention provides a method for producing a multi-gate FinFET, including forming a channel layer and a gate medium layer on a substrate; forming an amorphous silicon layer on the substrate, and etching the amorphous silicon layer by using an etching process, to form at least one fin; forming, by using an epitaxial growth process, a first protective layer from both sides to the middle of the substrate along a length direction of the at least one fin until a groove is formed in a middle location along the length direction of the at least one fin; forming a gate electrode layer on the substrate, performing planarization processing on the gate electrode layer to expose the first protective layer, and etching away the first protective layer by using the etching process, so as to form a gate electrode; and forming a source electrode and a drain electrode on the substrate.

In a first possible implementation manner of the first aspect, the substrate is a deeply depleted channel substrate or a fully depleted silicon-on-insulator substrate.

In a second possible implementation manner of the first aspect, the forming a channel layer on a substrate includes: forming, by using the epitaxial growth process, a first silicon layer and a second silicon layer on the substrate to serve as the channel layer.

In a third possible implementation manner of the first aspect, a crystal orientation of the substrate is <100>.

In a fourth possible implementation manner of the first aspect, the forming an amorphous silicon layer on the substrate, and etching the amorphous silicon layer by using an etching process, to form at least one fin includes: forming a second protective layer on the substrate by using the epitaxial growth process, and etching the second protective layer by using a pattern composition process, so as to form a fin pattern; forming a fin sidewall layer on the substrate by using the epitaxial growth process, etching the fin sidewall layer by using an anisotropic etching process, and etching away the fin pattern by using the etching process, so as to form a fin sidewall; forming the amorphous silicon layer on the substrate by using the epitaxial growth process, and etching the amorphous silicon layer by using the anisotropic etching process; and etching away the fin sidewall on the substrate by using the etching process, to form an even number of fins, or etching away the fin sidewall and one outermost fin by using the etching process, to form an odd number of fins.

According to the fourth possible implementation manner of the first aspect, in a fifth possible implementation manner, the fin sidewall and the at least one fin satisfy a formula:

$$D_{Spacer}=2\times W_{Fin}+W_{Spacer},$$

where $D_{Spacer}$ is a spacing between adjacent fin sidewalls, $W_{Fin}$ is a width of the at least one fin, and $W_{Spacer}$ is a width of the fin sidewall.

In a sixth possible implementation manner of the first aspect, the etching process for the etching away the first protective layer is a selective etching process.

In a seventh possible implementation manner of the first aspect, a width, of the groove, along the length direction of the at least one fin is: $W=2\times H_{Fin}+W_{Fin}$, where W is the width, of the groove, along the length direction of the at least one fin, $H_{Fin}$ is a height of the at least one fin, and $W_{Fin}$ is a width of the fin.

According to a second aspect, an embodiment of the present invention provides a method for producing a multi-gate FinFET, including forming a channel layer and a gate medium layer on a substrate; forming an amorphous silicon layer on the substrate, and etching the amorphous silicon layer by using an etching process, to form at least one fin; forming a gate electrode layer on the substrate, performing planarization processing on the gate electrode layer, and forming, by using an epitaxial growth process, a first protective layer from both sides to the middle of the substrate along a length direction of the at least one fin until a groove is formed in a middle location along the length direction of the at least one fin; forming a third protective layer on the substrate, performing planarization processing on the third protective layer to expose the first protective layer, and etching away the first protective layer by using the etching process; etching away the exposed gate electrode layer by using an anisotropic etching process, and etching away the third protective layer by using the etching process, so as to form a gate electrode; and forming a source electrode and a drain electrode on the substrate.

In a first possible implementation manner of the second aspect, the substrate is a deeply depleted channel substrate or a fully depleted silicon-on-insulator substrate.

In a second possible implementation manner of the second aspect, the forming a channel layer on a substrate includes forming, by using the epitaxial growth process, a first silicon layer and a second silicon layer on the substrate to serve as the channel layer.

In a third possible implementation manner of the second aspect, a crystal orientation of the substrate is <100>.

In a fourth possible implementation manner of the second aspect, the forming an amorphous silicon layer on the substrate, and etching the amorphous silicon layer by using an etching process, to form at least one fin includes forming a second protective layer on the substrate by using the epitaxial growth process, and etching the second protective layer by using a pattern composition process, so as to form a fin pattern; forming a fin sidewall layer on the substrate by using the epitaxial growth process, etching the fin sidewall layer by using the anisotropic etching process, and etching away the fin pattern by using the etching process, so as to form a fin sidewall; forming the amorphous silicon layer on the substrate by using the epitaxial growth process, and etching the amorphous silicon layer by using the anisotropic etching process; and etching away the fin sidewall on the substrate by using the etching process, to form an even number of fins, or etching away the fin sidewall and one outermost fin by using the etching process, to form an odd number of fins.

According to the fourth possible implementation manner of the second aspect, in a fifth possible implementation manner, the fin sidewall and the fin satisfy a formula:

$$D_{Spacer} = 2 \times W_{Fin} + W_{Spacer},$$

where $D_{Spacer}$ is a spacing between adjacent fin sidewalls, $W_{Fin}$ is a width of each fin, and $W_{Spacer}$ is a width of the fin sidewall.

In a sixth possible implementation manner of the second aspect, the etching processes for the etching away the first protective layer and the third protective layer are both a selective etching process.

According to a sixth possible implementation manner of the second aspect, in a seventh possible implementation manner, the first protective layer and the third protective layer are made of different materials.

In an eighth possible implementation manner of the second aspect, a width, of the groove, along the length direction of the at least one fin is $W = 2 \times H_{Fin} + W_{Fin}$, where W is the width, of the groove, along the length direction of the at least one fin, $H_{Fin}$ is a height of the fin, and $W_{Fin}$ is a width of the fin.

According to the method for producing a multi-gate FinFET according to the embodiments of the present invention, a gate electrode of the multi-gate FinFET is formed by using an epitaxial growth process and an etching process, so as to implement alignment of the gate electrode and a central location, of the fin, along a length direction, solve a problem of imbalance of series resistance between a drain electrode and a source electrode, enable a drain-electrode current to be stable, and ensure component performance of the multi-gate FinFET.

BRIEF DESCRIPTION OF THE DRAWINGS

To describe the technical solutions in the embodiments of the present invention more clearly, the following briefly introduces the accompanying drawings required for describing the embodiments. The accompanying drawings in the following description show some embodiments of the present invention, and persons of ordinary skill in the art may still derive other drawings from these accompanying drawings without creative efforts.

DETAILED DESCRIPTION

To make the objectives, technical solutions, and advantages of the embodiments of the present invention clearer, the following clearly describes the technical solutions in the embodiments of the present invention with reference to the accompanying drawings in the embodiments of the present invention. The described embodiments are a part rather than all of the embodiments of the present invention. All other embodiments obtained by persons of ordinary skill in the art based on the embodiments of the present invention without creative efforts shall fall within the protection scope of the present invention.

Embodiment 1

FIG. 1A to FIG. 1G are process flowcharts of Embodiment 1 of a method for producing a multi-gate FinFET according to the present invention. The method is suitable for manufacturing the multi-gate FinFET, and the method in this embodiment may include the following steps.

Step 11. Form a channel layer and a gate medium layer on a substrate.

Figure 1A:
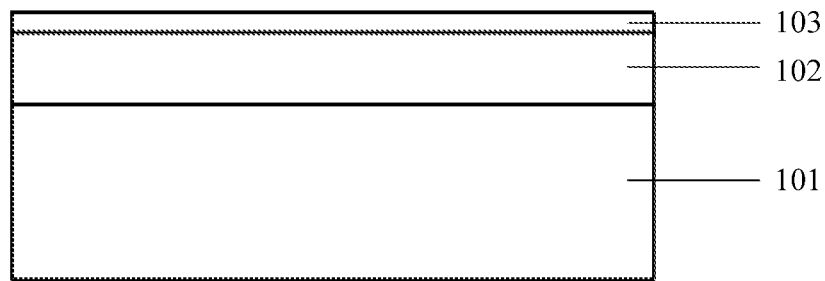
FIG. 1A to FIG. 1G are process flowcharts of Embodiment 1 of a method for producing a multi-gate FinFET according to the present invention.

As shown in FIG. 1A, a channel layer 102 is formed on a substrate 101, and then a gate medium layer 103 is formed on the channel layer 102. For the channel layer 102, a silicon layer may be deposited on the substrate to form a channel region of the multi-gate FinFET in an ion injection manner; and the channel layer 102 may also be directly formed on a silicon substrate in the ion injection manner, which can be selected according to an actual process requirement. For the gate medium layer 103, a gate medium may be formed by using a thermal oxidation process to grow $SiO_2$ on the channel layer 102, and the gate medium layer 103 may also be formed by using a chemical vapor deposition (CVD) process to deposit high K materials such as $Al_2O_3$ on the channel layer 102, which, however, is not construed as a limitation.

Step 12. Form an amorphous silicon layer on the substrate, and etch the amorphous silicon layer by using an etching process, to form at least one fin.

Figure 1B:
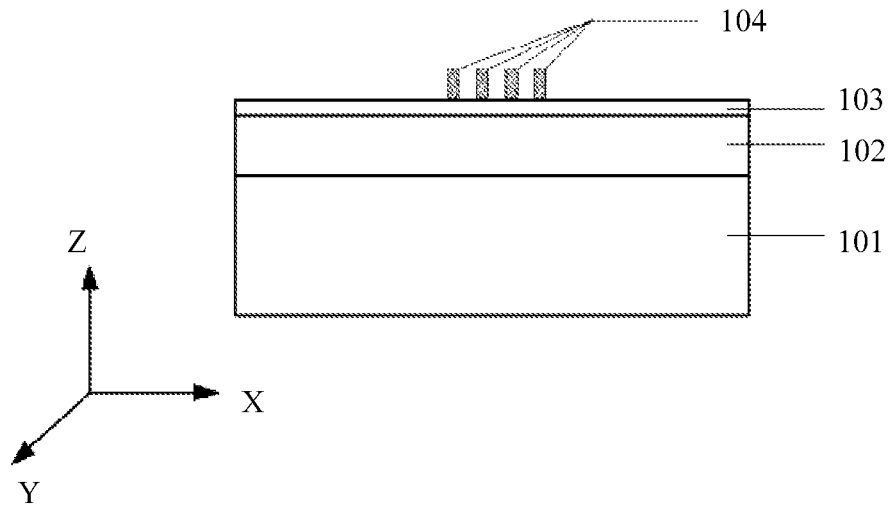

As shown in FIG. 1B, FIG. 1B is a sectional view along an XZ plane in a procedure of manufacturing the multi-gate FinFET. The amorphous silicon layer is formed on the gate medium layer 103 by using a deposition process, and at least one fin 104 is formed by using a pattern composition etching process such as an exposure mask. Four fins are used in the figure as an example for description, which, however, is not construed as a limitation.

Step 13. Form, by using an epitaxial growth process, a first protective layer from both sides to the middle of the substrate along a length direction of the at least one fin until a groove is formed in a middle location along the length direction of the at least one fin.

Figure 1C:
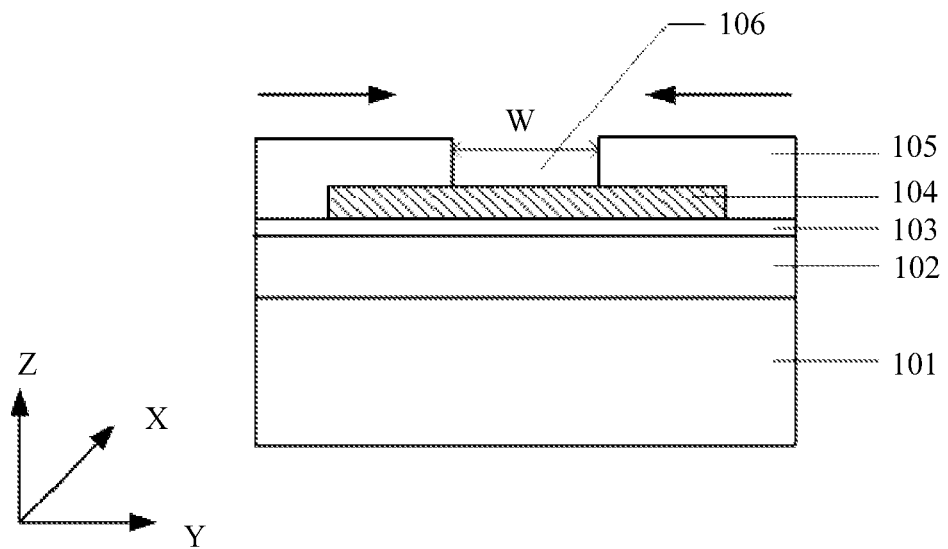
Figure 1D:
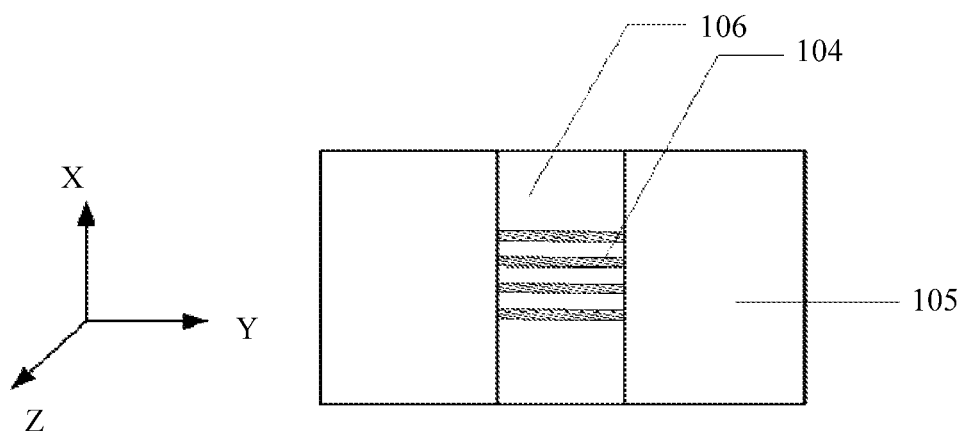

As shown in FIG. 1C and FIG. 1D, FIG. 1C is a sectional view along a YZ plane in the procedure of manufacturing the multi-gate FinFET, and FIG. 1D is a top view of FIG. 1C. A first protective layer 105 is formed by using an epitaxial growth process, such as a selective epitaxial growth (SEG) process, from both sides to the middle (directions of arrows in the figure) of the substrate along a length direction of at least one fin 104 until a groove 106 shown in the figure is formed in a middle location along the length direction of the at least one fin 104.

The first protective layer 105 may be a material with a protection function, such as silicon dioxide and silicon nitride, which, however, is not construed as a limitation. The epitaxial growth process is featured with advantages such as high process precision and strong controllability, so that a size of the formed groove 106 can be precisely controlled, where a thickness of the groove 106 is a thickness of the first protective layer, which can be preset by a thickness of a gate electrode to be formed in a next step; and to enable the gate electrode to be formed in the next step to be located in a central location, of the fin, along the length direction, two sides, of the first protective layer 105, extended from the substrate are required to have a same process condition to form the first protective layer 105 with two sides of a same size, thereby enabling the groove 106 to be located in the central location of a surface of the substrate, as shown in FIG. 1C, and a width (that is, a width W, of the groove, along the length direction of the at least one fin 104) of the groove 106 is greater than or equal to an effective channel length of the multi-gate FinFET to ensure a gate control ability.

Step 14. Form a gate electrode layer on the substrate, perform planarization processing on the gate electrode layer to expose the first protective layer, and etch away the first protective layer by using the etching process, so as to form a gate electrode.

Figure 1E:
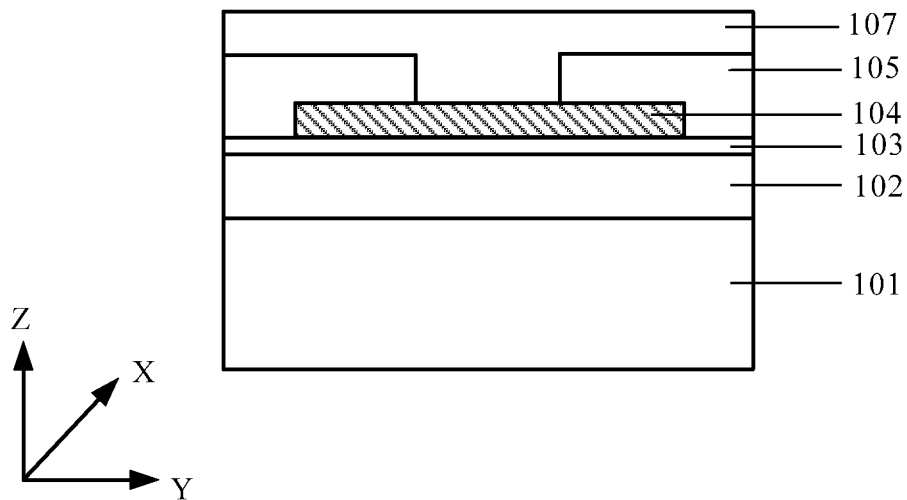
Figure 1F:
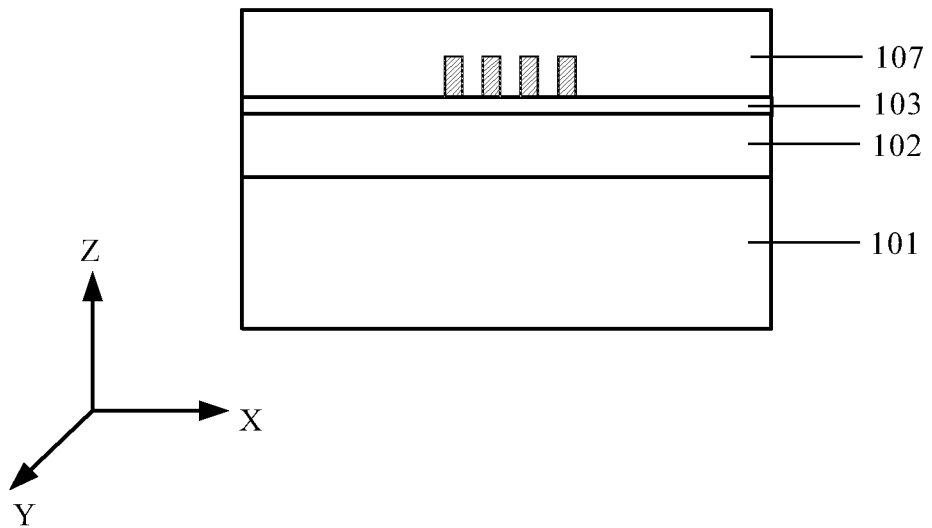

FIG. 1E is a sectional view along the YZ plane in the procedure of manufacturing the multi-gate FinFET, and FIG. 1F is a sectional view along the XZ plane in the procedure of manufacturing the multi-gate FinFET. As shown in FIG. 1E, a gate electrode layer 107 is deposited on the entire substrate, and a thickness of the gate electrode layer 107 is greater than a depth of the groove 106, so as to ensure that a thickness of the gate electrode after the planarization processing in a next step meets a predesigned requirement. The planarization processing is performed on the gate electrode layer 107 to expose the first protective layer 105, then the first protective layer 105 is etched away by using the etching process, and ultimately a structure shown in FIG. 1F is formed.

The planarization processing may be a chemical mechanical planarization (CMP) process, which, however, is not construed as a limitation. The etching process may be plasma etching, photoetching, and the like.

Step 15. Form a source electrode and a drain electrode on the substrate.

Figure 1G:
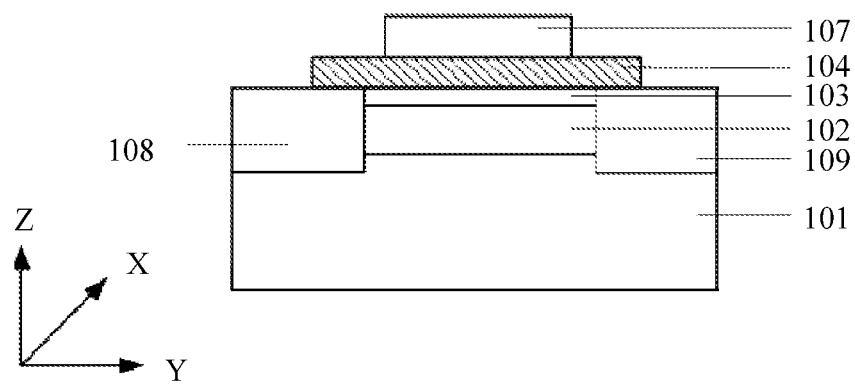

As shown in FIG. 1G, FIG. 1G is a sectional view along the YZ plane in the procedure of manufacturing the multi-gate FinFET. A source region 108 and a drain region 109 may be formed on the source region and the drain region of the substrate by using a process of ion injection, which, however, is not construed as a limitation, and the source region and the drain region may also be formed by another process. After the source region and the drain region are made, a passivation layer is deposited, a contact hole is etched, metallization is performed, and the like, which are all implemented by using a complementary metal-oxide-semiconductor (CMOS) process, and ultimately the multi-gate FinFET is formed. The multi-gate FinFET may be an FET of an N type, and may also be an FET of a P type, which can be determined according to an actual manufacturing requirement.

In this embodiment, a groove is formed by performing epitaxial growth processing on a first protective layer, so as to implement alignment of a gate electrode and a central location, of a fin, along a length direction, solve a problem of imbalance of series resistance between a drain electrode and a source electrode, enable a drain-electrode current to be stable, and ensure component performance of the multi-gate FinFET.

Preferably, based on the foregoing embodiment, the substrate may be a deeply depleted channel (DDC) substrate. Advantages for this lie in that the DDC substrate can be implemented by using a general CMOS process; and compared with a conventional transistor technology, a transistor with the DDC substrate as a substrate, that is, a DDC transistor, is better for working with low power consumption. By reducing 50% of a threshold voltage ($V_T$) variation, the DDC transistor may implement supply voltage reduction by 30% or more, and maintain a same system clock speed and reduce overall leakage. By increasing carrier mobility of a channel, the DDC transistor may increase a drive current by more than 10%.

Preferably, based on the foregoing embodiment, the substrate may also be a fully depleted silicon-on-insulator (FD-SOI) substrate. Advantages for this lie in that a transistor with the FD-SOI as a substrate is featured with a larger current driving ability, a sheer subthreshold slope, a smaller short channel effect, a narrow channel effect and full elimination of a kink effect, and the like.

Preferably, based on the foregoing embodiment, a crystal orientation of the substrate is <100>. Advantages for this lie in that an electron or hole mobility of the substrate can be increased by using the <100> crystal orientation. A hole is used as an example, and a mobility of the hole can be increased by 62% to 78% by using the <100> crystal orientation.

Preferably, based on the foregoing embodiment, the etching process for the etching away the first protective layer is a selective etching process. Advantages for this lie in that the selective etching process may selectively etch the first protective layer without etching a gate electrode layer material, which may ensure that the first protective layer is accurately etched and a gate electrode layer pattern is not damaged, further ensures that the gate electrode is aligned with the central location, of the fin, along the length direction, and may save a mask process, reduce a process step and reduce process costs.

Preferably, based on the foregoing embodiment, a width, of the groove, along the length direction of the at least one fin is $W=2\times H_{Fin}+W_{Fin}$ where W is the width, of the groove, along the length direction of the at least one fin, $H_{Fin}$ is a height of the fin, and $W_{Fin}$ is a width of the fin. The width W, of the groove, along the length direction of the fin is the width (which is marked in the figure) of the groove 106 in FIG. 1C, and for the height $H_{Fin}$ of the fin and the width $W_{Fin}$ of the fin, refer to the height and the width of the fin in FIG. 1B. Advantages for this lie in that the width of the groove 106 can be accurately controlled to be greater than or equal to an effective channel length of the manufactured FinFET, to ensure a width of the gate electrode and ensure a gate control ability of the multi-gate FinFET.

Embodiment 2

Figure 2:
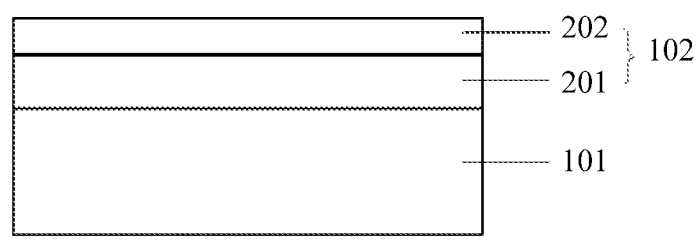
FIG. 2 is a process flowchart of Embodiment 2 of a method for producing a multi-gate FinFET according to the present invention.

FIG. 2 is a process flowchart of Embodiment 2 of a method for producing a multi-gate FinFET according to the present invention. This embodiment is based on the foregoing embodiment, and the forming a channel layer on a substrate includes forming, by using an epitaxial growth process, a first silicon layer and a second silicon layer on the substrate to serve as the channel layer.

As shown in FIG. 2, a first silicon layer 201 is formed on the substrate 101 by using the epitaxial growth process, where the first silicon layer 201 is a silicon layer with an ion concentration. Manufacturing of the multi-gate FinFET of a P type is used as an example, the first silicon layer 201 may be a silicon layer with boron ions $B^+$, which is used to perform a threshold voltage adjustment. A second silicon layer 202 with an ion concentration is then epitaxially grown on the first silicon layer 201 by using the epitaxial growth process. Manufacturing of the multi-gate FinFET of the P type is used as an example, ions of the second silicon layer 202 may be $B^+$, of which a doping concentration may be $1 \times 10^{15}$ centimeters$^{-3}$ (cm$^{-3}$)~$1 \times 10^{16}$ cm$^{-3}$ and an epitaxial growth thickness may be 0.3 micrometers (μm) to 0.5 μm, which, however, is not construed as a limitation. The first silicon layer 201 and the second silicon layer 202 form the channel layer 102.

In this embodiment, the channel layer is grown by using an epitaxial growth process, which solves a series of problems, of rough interface, high crystal lattice damage and low activation rate and the like, caused by forming of a channel by using an ion injection process.

Preferably, a thin sacrificial layer may be set between the first silicon layer and the second silicon layer, where the sacrificial layer may be a material with a protection function, such as silicon dioxide. Advantages for this lie in that doping uniformity of the channel layer can be ensured and channel conductivity of the multi-gate FinFET is improved.

Embodiment 3

FIG. 3A to FIG. 3E are process flowcharts of Embodiment 3 of a method for producing a multi-gate FinFET according to the present invention. This embodiment is based on the foregoing embodiments, and the forming an amorphous silicon layer on the substrate, and etching the amorphous silicon layer by using an etching process, to form at least one fin includes the following steps.

Step 31. Form a second protective layer on the substrate by using an epitaxial growth process, and etch the second protective layer by using a pattern composition process, so as to form a fin pattern.

Figure 3A:
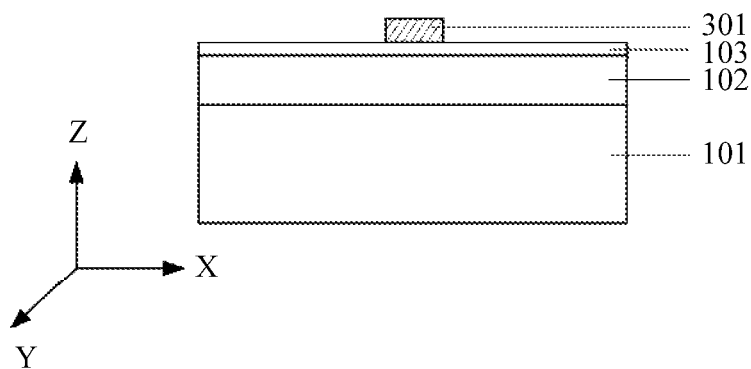
FIG. 3A to FIG. 3E are process flowcharts of Embodiment 3 of a method for producing a multi-gate FinFET according to the present invention.

As shown in FIG. 3A, FIG. 3A is a sectional view along an XZ plane in a procedure of manufacturing the multi-gate FinFET. The second protective layer is formed, by using the epitaxial growth process, on the substrate on which the gate medium layer 103 is formed, and the second protective layer is etched by using a pattern composition process to form a fin pattern 301 shown in FIG. 3A, where the pattern composition process may be mask etching, such as photoetching and plasma etching, which, however, is not construed as a limitation.

Step 32. Form a fin sidewall layer on the substrate by using the epitaxial growth process, etch the fin sidewall layer by using an anisotropic etching process, and etch away the fin pattern by using the etching process, so as to form a fin sidewall.

Figure 3B:
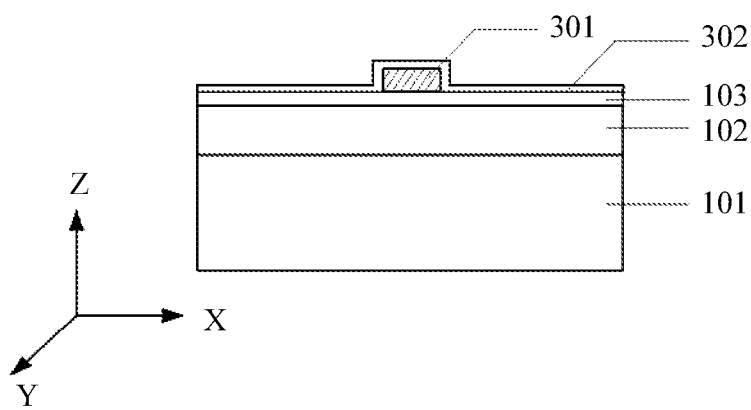
Figure 3C:
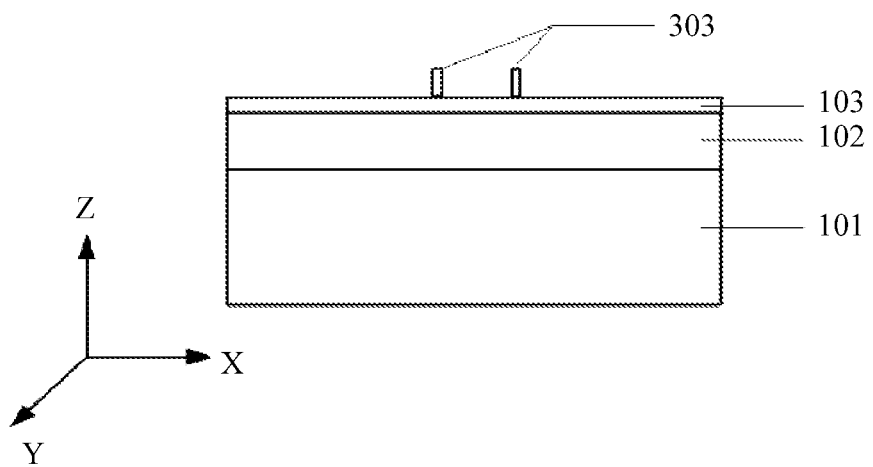

As shown in FIG. 3B and FIG. 3C, FIG. 3B and FIG. 3C are sectional views along the XZ plane in the procedure of manufacturing the multi-gate FinFET. The fin sidewall layer 302 is formed on the substrate by using the epitaxial growth process, the fin sidewall layer 302 is etched by using the anisotropic etching process, a fin sidewall layer 302 material at a sidewall of the fin pattern 301 is left, and then the fin pattern 301 is etched away by using an etching process such as a selective etching process, which, however, is not construed as a limitation. On a surface of the gate medium layer 103, only the fin sidewall layer 302 material at the sidewall of the fin pattern 301 is left, that is, the fin sidewall 303 is formed.

The anisotropic etching process is a corrosion method of which corrosion rates along different crystallographic planes are different. The method has advantages, such as, a process development level is high, and a structural geometry size can be precisely controlled, and the method is used in a manufacturing process requiring high precision. The anisotropic etching may be a dry anisotropic etching, and may also be a wet anisotropic etching, which may be determined according to an actual manufacturing process.

Step 33. Form an amorphous silicon layer on the substrate by using the epitaxial growth process, and etch the amorphous silicon layer by using the anisotropic etching process.

Figure 3D:
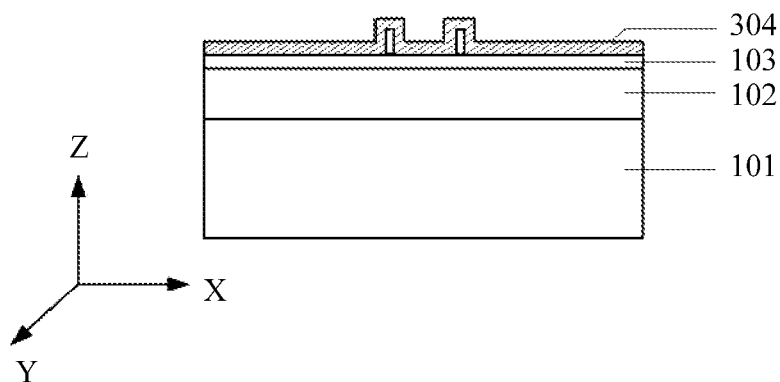
Figure 3E:
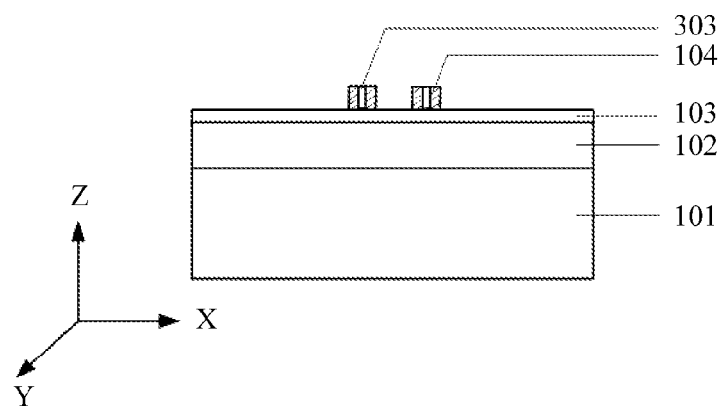

As shown in FIG. 3D and FIG. 3E, FIG. 3D and FIG. 3E are sectional views along the XZ plane in the procedure of manufacturing the multi-gate FinFET. An amorphous silicon layer 304 is formed on the substrate by using the epitaxial growth process, and the amorphous silicon layer 304 is etched, by using the anisotropic etching process, to form amorphous silicon, as shown in FIG. 3E, which only exists in a sidewall location of the fin sidewall 303.

Step 34. Etch away the fin sidewall on the substrate by using the etching process, to form an even number of fins, or etch away the fin sidewall and one outermost fin by using the etching process, to form an odd number of fins.

As shown in FIG. 3E and FIG. 1B, if an even number of fins 104 are required, the fin sidewall 303 is etched away, by using the etching process such as the selective etching process, on the substrate to form the even number of fins 104, such as four fins 104 in FIG. 1B; if an odd number of fins 104 are required, the fin sidewall 303 is etched away on the substrate by using the etching process, and then one outermost fin 104 is etched away to form the odd number of fins 104.

In this embodiment, multiple fins are precisely grown and formed by using an epitaxial growth process for three times, which implements precise control of a fin size and improves a channel control ability of the multi-gate FinFET.

Preferably, based on the foregoing embodiment, the fin sidewall and the fin satisfy a formula $D_{Spacer}=2 \times W_{Fin}+W_{Spacer}$, where $D_{Spacer}$ is a spacing between adjacent fin sidewalls, $W_{Fin}$ is a width of each fin, and $W_{Spacer}$ is a width of the fin sidewall.

Figure 4:
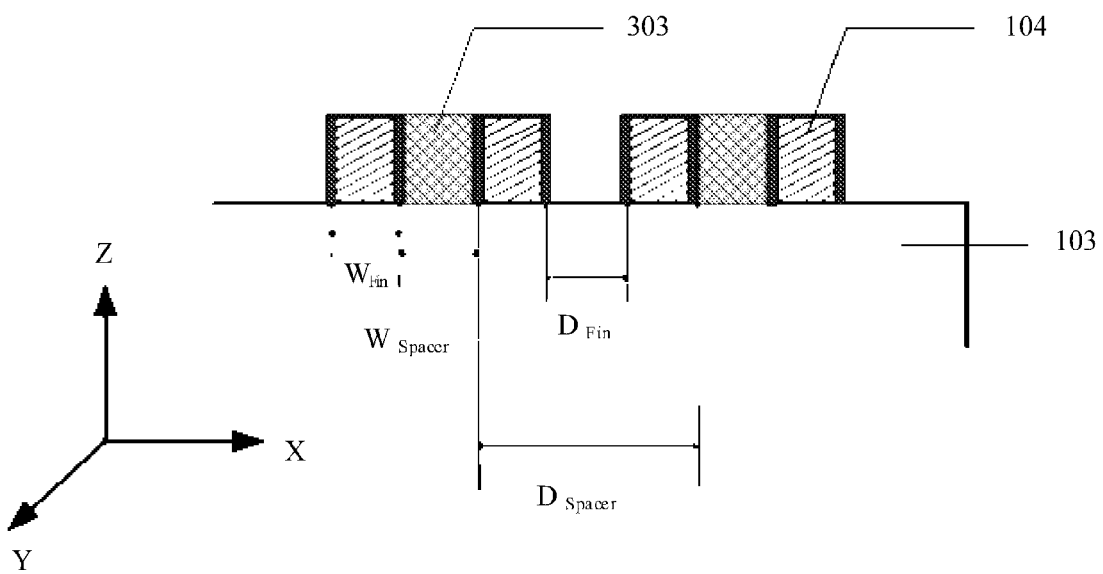
FIG. 4 is a partial enlarged diagram of Embodiment 3 of a method for producing a multi-gate FinFET according to the present invention.

FIG. 4 is a partial enlarged diagram of Embodiment 3 of a method for producing the multi-gate FinFET according to the present invention. As shown in FIG. 4, four fins 104 are used as an example for description, to ensure same spacings between the fins 104, a spacing $D_{Fin}$ between the middle two fins 104 needs to be the same as a width $W_{Spacer}$ of the fin sidewall 303, that is, $D_{Fin}=W_{Spacer}$. To satisfy this condition, it only needs to satisfy the formula $D_{Spacer}=2 \times W_{Fin}+W_{Spacer}$. Therefore, before multiple fins are made, widths and spacings of the fin sidewall 303 and the fins 104 can be predesigned by means of the formula to ensure same spacings between the multiple fins.

Embodiment 4

FIG. 5A to FIG. 5F are process flowcharts of Embodiment 4 of a method for producing a multi-gate FinFET according to the present invention. The method is suitable for manufacturing the multi-gate FinFET, and the method in this embodiment may include the following steps.

Step 51. Form a channel layer and a gate medium layer on a substrate.

Specific process implementation of step 51 in this embodiment is similar to the process implementation procedure of step 11, which is not repeatedly described herein.

Step 52. Form an amorphous silicon layer on the substrate, and etch the amorphous silicon layer by using an etching process, to form at least one fin.

Specific process implementation of step 52 in this embodiment is similar to the process implementation procedure of step 12, which is not repeatedly described herein.

Step 53. Form a gate electrode layer on the substrate, perform planarization processing on the gate electrode layer, and form, by using an epitaxial growth process, a first protective layer from both sides to the middle of the substrate along a length direction of the fin until a groove is formed in a middle location along the length direction of the at least one fin.

Figure 5A:
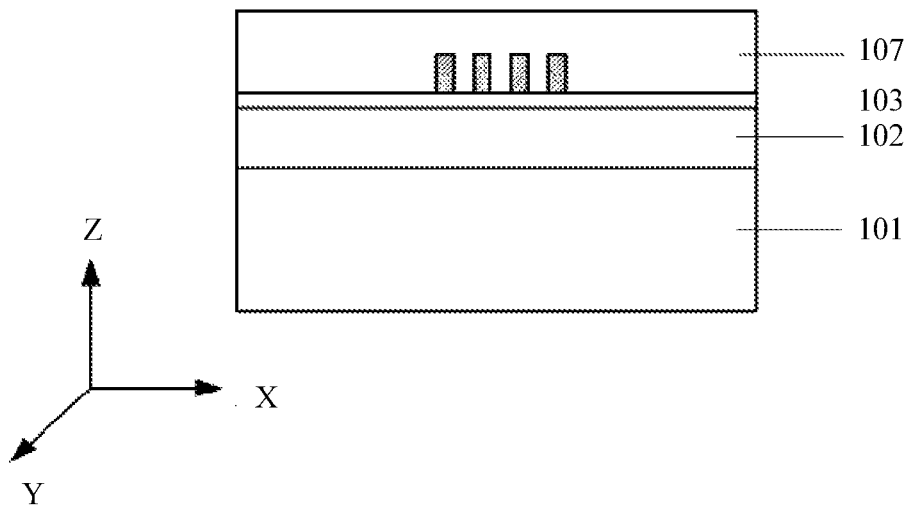
FIG. 5A to FIG. 5F are process flowcharts of Embodiment 4 of a method for producing a multi-gate FinFET according to the present invention.
Figure 5B:
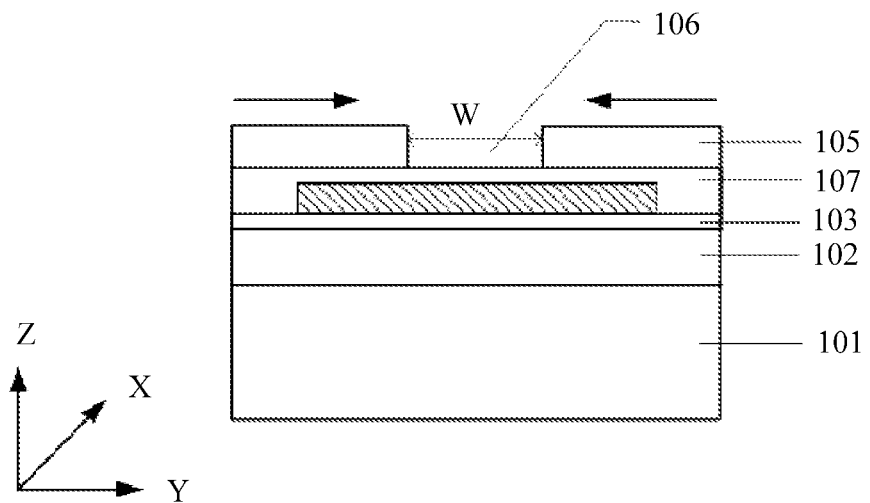

As shown in FIG. 5A and FIG. 5B, FIG. 5A is a sectional view along an XZ plane in a procedure of manufacturing the multi-gate FinFET, and FIG. 5B is a sectional view along a YZ plane in the procedure of manufacturing the multi-gate FinFET. A gate electrode layer 107 is formed on the substrate, planarization processing is performed on the gate electrode layer 107, and it is ensured that a thickness of the gate electrode layer 107 satisfies a predesigned requirement of manufacturing the multi-gate FinFET, and then a first protective layer 105 is formed, by using the epitaxial growth process, from both sides to the middle (directions of arrows in the figure) of the substrate along the length direction of the at least one fin until a groove 106 is formed in a middle location along the length direction of the at least one fin.

Step 54. Form a third protective layer on the substrate, perform planarization processing on the third protective layer to expose the first protective layer, and etch away the first protective layer by using the etching process.

Figure 5C:
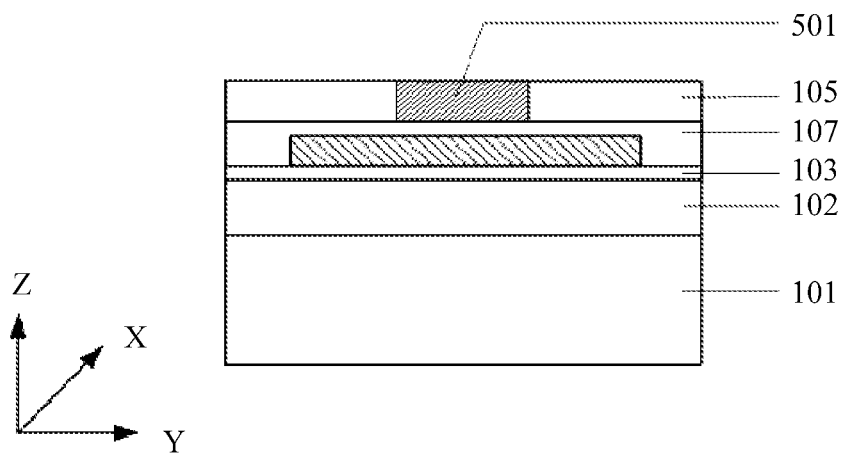
Figure 5D:
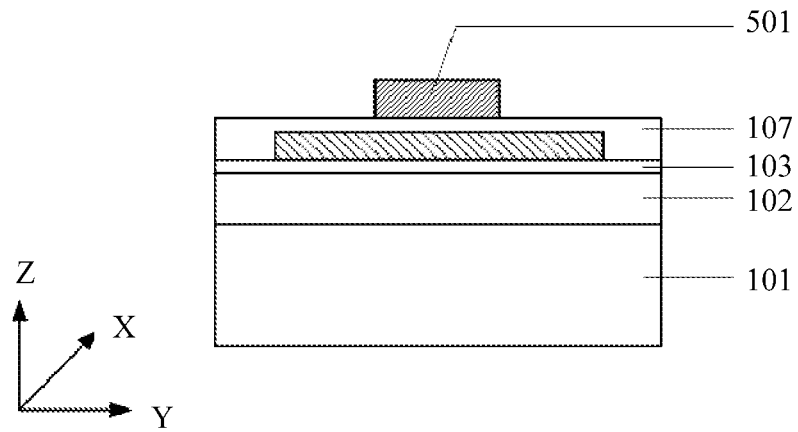

As shown in FIG. 5C and FIG. 5D, FIG. 5C and FIG. 5D are sectional views along the YZ plane in the procedure of manufacturing the multi-gate FinFET. A third protective layer 501 is formed on the substrate by using, for example, a CVD process, the first protective layer 105 is exposed by means of planarization processing, such as a CMP process, and then the first protective layer 105 may be etched away, by using the etching process, such as plasma etching and photoetching, to form a structure shown in FIG. 5D.

Step 55. Etch away the exposed gate electrode layer by using an anisotropic etching process, and etch away the third protective layer by using the etching process, so as to form a gate electrode.

Figure 5E:
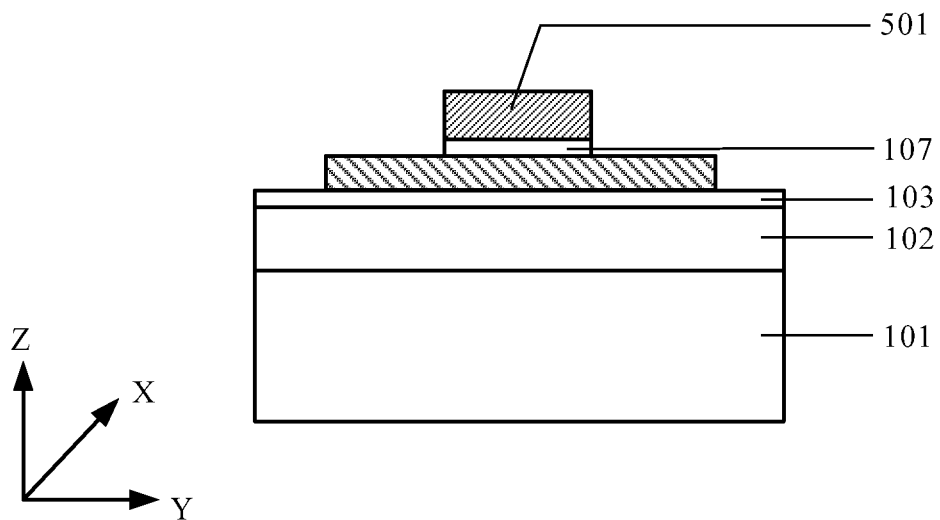
Figure 5F:
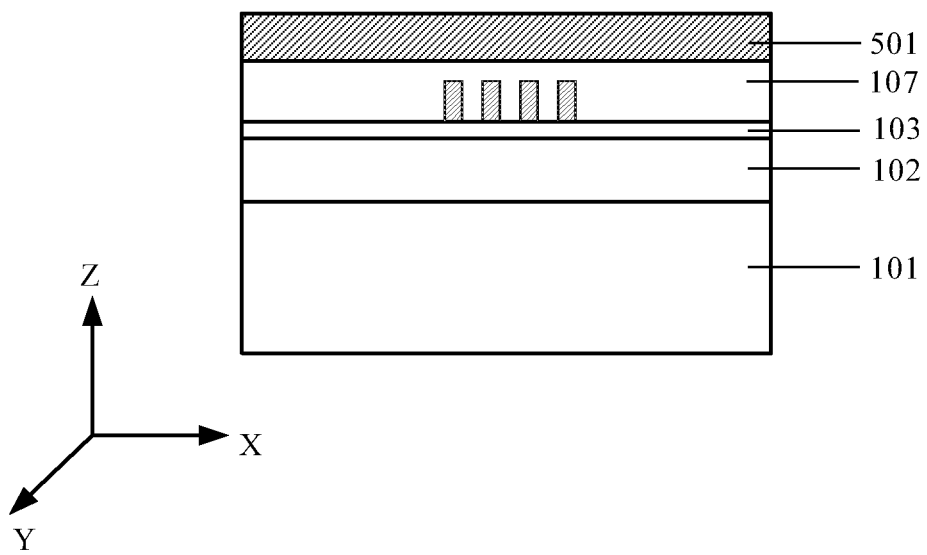

As shown in FIG. 5E, FIG. 5F, and FIG. 1F, FIG. 5E is a sectional view along the YZ plane in the procedure of manufacturing the multi-gate FinFET, FIG. 5F is a sectional view, of a structural diagram shown in FIG. 5E, along an XZ plane. The exposed gate electrode layer 107 is etched away on the substrate by using the anisotropic etching process, and then the third protective layer 501 is etched away by using an etching process, such as plasma etching and photoetching, or a CMP process, so as to form the gate electrode shown in FIG. 1F.

Step 56. Form a source electrode and a drain electrode on the substrate.

Specific process implementation of step 56 in this embodiment is similar to the process implementation procedure of step 15, which is not repeatedly described herein.

In this embodiment, a groove is formed by performing epitaxial growth processing on a first protective layer, so as to implement alignment of a gate electrode and a central location, of a fin, along a length direction, solve a problem of imbalance of series resistance between a drain electrode and a source electrode, enable a drain-electrode current to be stable, and ensure component performance of the multi-gate FinFET.

Preferably, based on the foregoing embodiment, the substrate may be a DDC substrate. Advantages for this lie in that the DDC substrate can be implemented by using a general CMOS process; and compared with a conventional transistor technology, a transistor with the DDC substrate as a substrate, that is, a DDC transistor, is better for working with low power consumption. By reducing 50% of a threshold voltage ($V_T$) variation, the DDC transistor may implement supply voltage reduction by 30% or more, and maintain a same system clock speed and reduce overall leakage. By increasing carrier mobility of a channel, the DDC transistor may increase a drive current by more than 10%.

Preferably, based on the foregoing embodiment, the substrate may also be a fully FD-SOI substrate. Advantages for this lie in that a transistor with the FD-SOI as a substrate is featured with a larger current driving ability, a sheer subthreshold slope, a smaller short channel effect, a narrow channel effect and full elimination of a kink effect, and the like.

Preferably, based on the foregoing embodiment, a crystal orientation of the substrate is <100>. Advantages for this lie in that an electron or hole mobility of the substrate can be increased by using the <100> crystal orientation. A hole is used as an example, and a mobility of the hole can be increased by 62% to 78% by using the <100> crystal orientation.

Preferably, based on the foregoing embodiment, the etching processes for the etching away the first protective layer and the third protective layer are both a selective etching process. Advantages for this lie in that the selective etching process may selectively etch the first protective layer and the third protective layer without etching a gate electrode layer material, which may ensure that the first protective layer and the third protective layer are accurately etched and a gate electrode layer pattern and the gate electrode are not damaged, further ensures that the gate electrode is aligned with the central location, of the fin, along the length direction, and may save a mask process, reduce a process step and reduce process costs.

Preferably, based on the foregoing embodiment, a width, of the groove, along the length direction of the at least one fin is $W=2\times H_{Fin}+W_{Fin}$ where W is the width, of the groove, along the length direction of the at least one fin, $H_{Fin}$ is a height of the fin, and $W_{Fin}$ is a width of the fin. The width W, of the groove, along the length direction of the fin is the width (which is marked in the figure) of the groove 106 in FIG. 1C, and for the height $H_{Fin}$ of the fin and the width $W_{Fin}$ of the fin, refer to the height and the width of the fin in FIG. 1B. Advantages for this lie in that the width of the groove 106 can be accurately controlled to be greater than or equal to an effective channel length of the manufactured FinFET, to ensure a width of the gate electrode and ensure a gate control ability of the multi-gate FinFET.

Preferably, based on the foregoing embodiment, the forming a channel layer on a substrate includes: forming, by using the epitaxial growth process, a first silicon layer and a second silicon layer on the substrate to serve as the channel layer. Specific process implementation is similar to that in Embodiment 2, which is not repeatedly described herein. Advantages for this lie in that the channel layer is grown by using the epitaxial growth process, which solves a series of problems, of rough interface, high lattice damage, low activation rate and the like, caused by forming of a channel by using an ion injection process. In addition, preferably, a thin sacrificial layer may be set between the first silicon layer and the second silicon layer, where the sacrificial layer may be a material with a protection function, such as silicon dioxide. Advantages for this lie in that doping uniformity of the channel layer can be ensured and channel conductivity of the multi-gate FinFET is improved.

Preferably, based on the foregoing embodiment, the forming an amorphous silicon layer on the substrate, and etching the amorphous silicon layer by using an etching process, to form at least one fin includes forming a second protective layer on the substrate by using an epitaxial growth process, and etching the second protective layer by using a pattern composition process, so as to form a fin pattern; forming a fin sidewall layer on the substrate by using the epitaxial growth process, etching the fin sidewall layer by using an anisotropic etching process, and etching away the fin pattern by using the etching process, so as to form a fin sidewall; forming the amorphous silicon layer on the substrate by using the epitaxial growth process, and etching the amorphous silicon layer by using the anisotropic etching process; and etching away the fin sidewall on the substrate by using the etching process, to form an even number of fins, or etching away the fin sidewall and one outermost fin by using the etching process, to form an odd number of fins. Specific process implementation is similar to that in Embodiment 3, which is not repeatedly described herein. Advantages for this lie in that multiple fins are precisely grown and formed by using the epitaxial growth process for three times, which implements precise control of a fin size and improves a channel control ability of the multi-gate FinFET.

Preferably, based on the foregoing embodiment, the first protective layer and the third protective layer are made of different materials. Advantages for this lie in that when the first protective layer is etched by using the selective etching process, particularly a non-mask selective etching process, the third protective layer may not be affected, which ensures protection for the gate electrode layer and reduces a process step.

Preferably, based on the foregoing embodiment, the fin sidewall and the fin satisfy a formula $D_{Spacer}=2\times W_{Fin}+W_{Spacer}$, where $D_{Spacer}$ is a spacing between adjacent fin sidewalls, $W_{Fin}$ is a width of each fin, and $W_{Spacer}$ is a width of the fin sidewall. Specific process implementation is similar to the process procedure in Embodiment 4, which is not repeatedly described herein. Advantages for this lie in that before multiple fins are made, widths and spacings of the fin sidewall and the fins can be predesigned by means of the formula to ensure same spacings between the multiple fins.

Finally, it should be noted that the foregoing embodiments are merely intended for describing the technical solutions of the present invention, but not for limiting the present invention. Although the present invention is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present invention.

What is claimed is:

1. A method for producing a multi-gate in field-effect transistor (FinFET), comprising:
   forming a channel layer and a gate medium layer on a substrate;
   forming an amorphous silicon layer on the substrate;
   etching the amorphous silicon layer by using an etching process to form at least one fin;
   forming, by using an epitaxial growth process, a first protective layer from both sides to the middle of the substrate along a length direction of the at least one fin until a groove is formed in a middle location along the length direction of the at least one fin;
   forming a gate electrode layer on the substrate;
   performing planarization processing on the gate electrode layer to expose the first protective layer;
   etching away the first protective layer by using the etching process to form a gate electrode centrally aligned with the at least one fin along the length direction of the at least one fin; and
   forming a source electrode and a drain electrode on the substrate,
   wherein centrally aligning the gate electrode with the at least one fin balances a series resistance between the source electrode and the drain electrode.

2. The method for producing the multi-gate FinFET according to claim 1, wherein the substrate is a fully depleted silicon-on-insulator substrate.

3. The method for producing the multi-gate FinFET according to claim 1, wherein forming the channel layer on the substrate comprises forming, by using the epitaxial growth process, a first silicon layer and a second silicon layer on the substrate to serve as the channel layer.

4. The method for producing the multi-gate FinFET according to claim 1, wherein a crystal orientation of the substrate is <100>.

5. The method for producing the multi-gate FinFET according to claim 1, wherein the etching process for etching away the first protective layer is a selective etching process.

6. The method for producing the multi-gate FinFET according to claim 1, wherein a width of the groove along the length direction of the at least one fin is $W=2\times H_{Fin}+W_{Fin}$, wherein W is the width of the groove along the length direction of the at least one fin, $H_{Fin}$ is a height of the at least one fin, and $W_{Fin}$ is a width of the fin.

7. The method for producing the multi-gate FinFET according to claim 1, wherein the substrate is a deeply depleted channel substrate.

8. The method for producing the multi-gate FinFET according to claim 1, wherein the gate medium is formed by a chemical vapor deposition process depositing $Al_2O_3$.

9. The method for producing the multi-gate FinFET according to claim 1, wherein the amorphous silicon layer is formed according to a deposition process.

10. The method for producing the multi-gate FinFET according to claim 1, wherein the planarization processing is a chemical mechanical planarization.

11. The method for producing the multi-gate FinFET according to claim 1 further comprising:
    depositing a passivation layer according to a complementary metal-oxide-semiconductor (CMOS) process;
    etching a contact hole according to the CMOS process; and
    performing metallization according to the CMOS process.

12. The method for producing the multi-gate FinFET according to claim 5, wherein the selective etching process selectively etches the first protective layer without etching the gate electrode layer.

13. The method for producing the multi-gate FinFET according to claim 1 further comprising etching the amorphous silicon layer by using the etching process to form a second fin before forming, by using the epitaxial growth process, the first protective layer.

* * * * *